United States Patent [19]

Lee

[11] 4,344,067

[45] Aug. 10, 1982

[54] ANALOG TO DIGITAL CONVERTER AND METHOD OF CALIBRATING SAME

[75] Inventor: Robert D. Lee, Austin, Tex.

[73] Assignee: Motorola, Inc., Schaumburg, Ill.

[21] Appl. No.: 96,276

[22] Filed: Nov. 21, 1979

[51] Int. Cl.³ .......................................... H03K 13/20
[52] U.S. Cl. ...................... 340/347 CC; 340/347 NT; 340/347 AD; 324/130
[58] Field of Search ................. 340/347 CC, 347 NT, 340/347 AD, 347 SH; 324/99 D, 130

[56] References Cited

U.S. PATENT DOCUMENTS

| | | | |
|---|---|---|---|
| 3,631,468 | 12/1971 | Spaid | 340/347 SH |
| 3,685,048 | 8/1972 | Pincus | 340/347 CC |
| 3,737,897 | 6/1973 | Cuthbert | 340/347 AD |
| 4,058,808 | 11/1977 | Malaviya | 324/99 D |
| 4,074,260 | 2/1978 | Butler | 340/347 CC |

Primary Examiner—Charles D. Miller
Attorney, Agent, or Firm—Anthony J. Sarli, Jr.; Joe E. Barbee; Robert L. King

[57] ABSTRACT

A single slope analog to digital converter uses a DAC to trim the discharge current of a capacitor during calibration thereof. A method of calibrating the analog to digital converter is provided which iterates required steps to obtain a correct current setting within a short period of time. The analog to digital converter discharges a capacitor through a high impedance to obtain a linear discharge. The time to discharge the capacitor appears in a counter and is indicative of the voltage across the capacitor at the beginning of the discharge period once the analog to digital converter has been calibrated.

11 Claims, 5 Drawing Figures

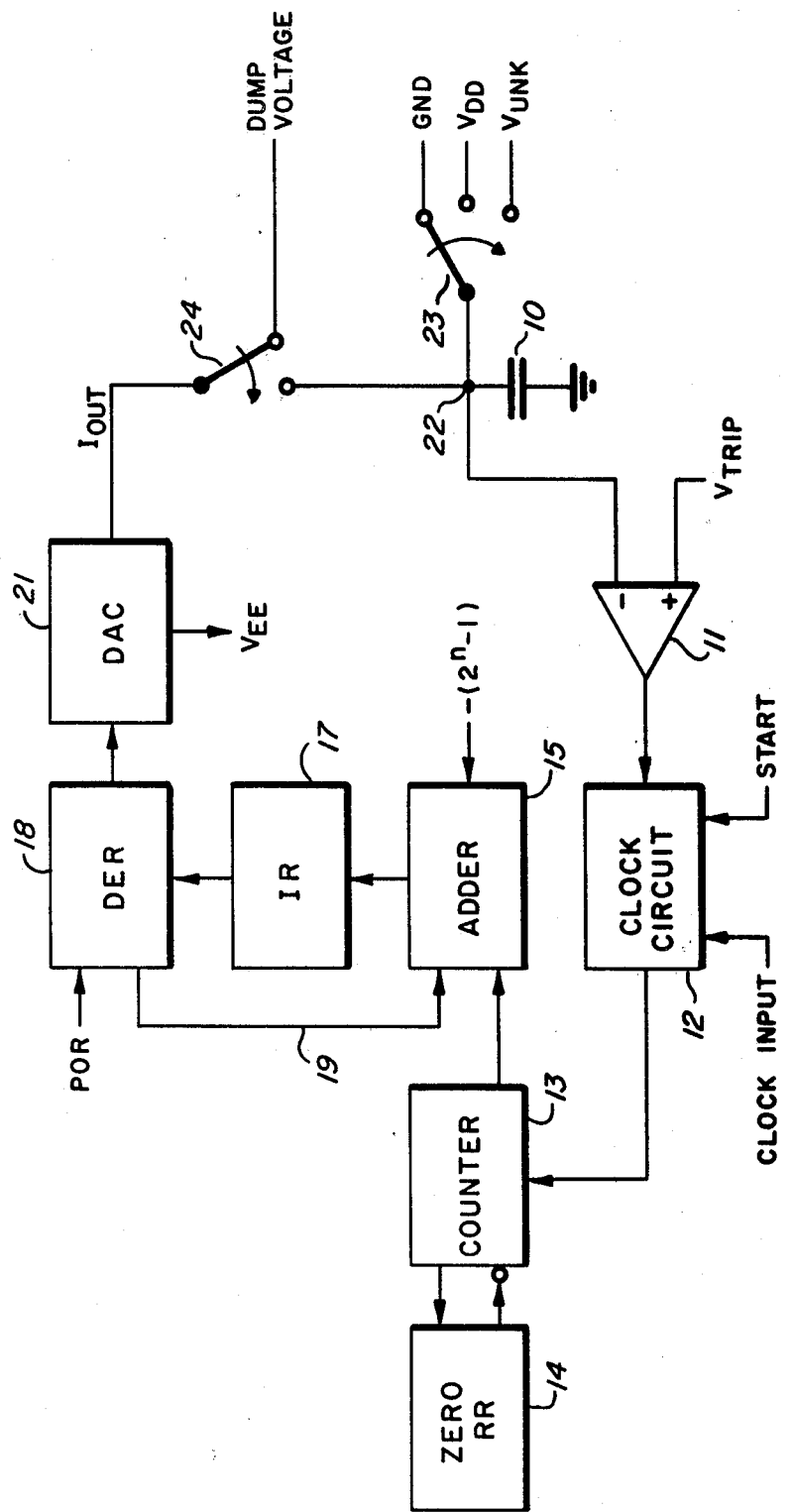

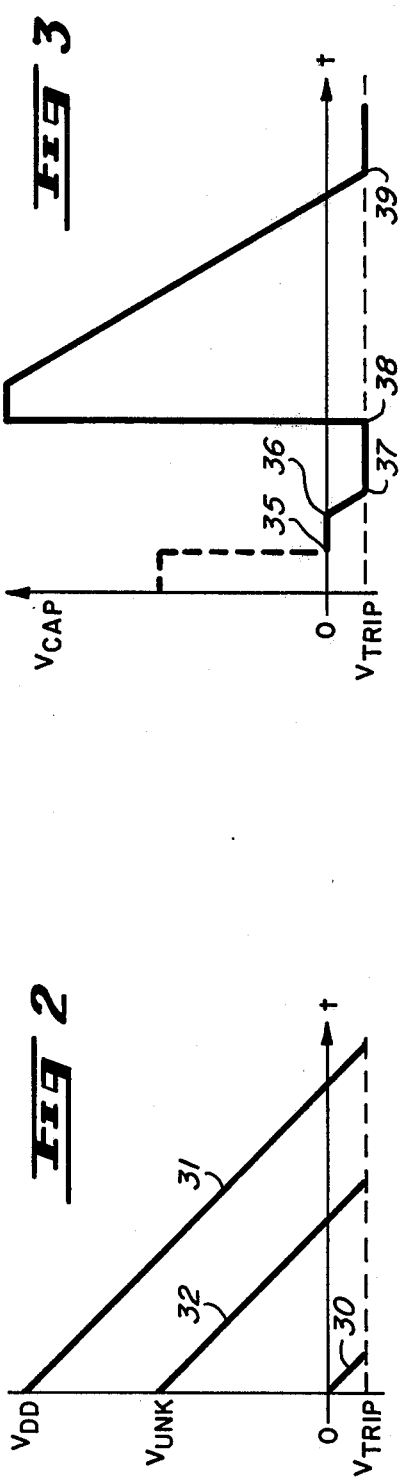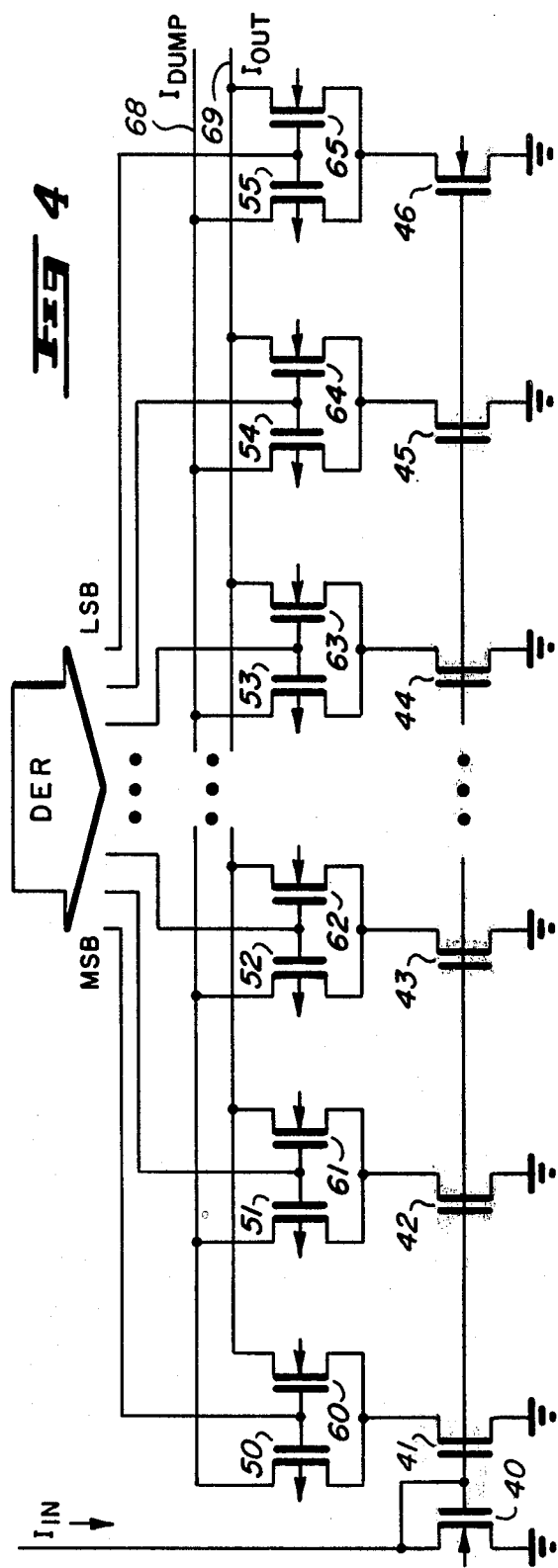

ANALOG TO DIGITAL CONVERTER AND METHOD OF CALIBRATING SAME

This invention relates, in general, to analog to digital converters, and more particularly, to a single slope analog to digital converter and a method for calibrating the analog to digital converter.

Circuitry for converting analog signals into corresponding, equivalent digital signals has a multiplicity of uses in present day instrumentation, telemetry, and control equipment. There are various types of analog to digital (A/D) converters known. These include the single ramp type, the double ramp type, voltage to frequency converters, the comparison type which includes a digital to analog converter and compares the output to the input, etc. Some A/D converters employ open loop techniques while yet others provide feedback techniques, such as, ramp and counter methods, and successive approximation to name a few. Most A/D converters have their respective problems such as inaccuracies, high cost, complexity of circuitry, etc. To some, accuracy is a problem with A/D converters of the ramp type because of the difficulty in achieving linear ramp voltages and maintaining fixed voltage crossing points. Also in some cases it has been found necessary to use a microprocessor in order to calculate the conversion. It has been found that a single slope A/D converter having internal calibration and a linear ramp can be provided which is accurate, yet does not require a microprocessor to calculate the conversion.

Accordingly, it is an object of the present invention to provide a single slope analog to digital converter which is self-calibrating.

Another object of the present invention is to provide an analog to digital converter which uses a digital to analog converter to trim a single slope discharge current based on power supply voltage and ground conversion results.

A further object of the present invention is to provide a single slope analog to digital converter which can be integrated on a single integrated circuit chip, is self-calibrating, and does not require a microprocessor to calculate the conversion.

Yet a further object of the present invention is to provide a method of calibrating a single slope analog to digital converter by using a digital to analog converter to trim the discharge current.

SUMMARY OF THE INVENTION

In accomplishing the above and other objects of the present invention, there is provided in one form thereof, a single slope analog to digital converter. The analog to digital converter includes a capacitor which can be charged to a predetermined voltage or can be charged with the unknown voltage. The capacitor is discharged under the control of a digital to analog converter to calibrate the A/D converter. The voltage on the capacitor is sensed by a comparator which provides an output when the capacitor has discharged to a level equal to a predetermined reference voltage. The output of the comparator is used to stop a clock circuit. During the time that the capacitor is discharging, the clock circuit provides an output signal to a counter. The counter provides an output which is coupled to a digital to analog enable register. The digital to analog enable register provides outputs which control the digital to analog converter. The digital to analog enable register and the digital to analog converter are used during self-calibration of the A/D converter.

Also provided is a method for calibrating a single slope analog to digital converter. Calibration is started by resetting the counter and the digital to analog converter and then establishing ground on the capacitor. The capacitor is then discharged at a rate controlled by the digital to analog converter. When the charge on the capacitor reaches a predetermined level a comparator provides an output which stops a clock circuit. The clock circuit had been providing pulses to the counter and once the clock circuit is stopped the counts contained in the counter are converted to a two's complement number. The capacitor is then charged up to a voltage level which is substantially equal to the maximum voltage expected to be converted. Once again the capacitor is discharged through control of the digital to analog converter and the clock circuit is enabled. When the capacitor discharges to the predetermined level the clock circuit is stopped, and the procedure is repeated until the counts in the counter equal $2^n - 1$ where n is the number of bits that the analog to digital converter is capable of providing as a binary output.

The subject matter which is regarded as the invention is set forth in the appended claims. The invention itself, however, together with further objects and advantages thereof, may be better understood by referring to the following detailed description description taken in conjunction with the accompanying drawings.

BRIEF DESCRIPTION OF THE DRAWINGS

FIG. 1 represents, in block diagram form, an embodiment of the present invention;

FIG. 2 represents in graph form discharge curves of the capacitor in FIG. 1;

FIG. 3 illustrates in graph form a portion of the calibration cycle of the circuitry of FIG. 1;

FIG. 4 illustrates in schematic form a portion of the digital to analog converter (DAC) used in the circuitry of FIG. 1.

DETAILED DESCRIPTION OF THE DRAWINGS

Figure 5:
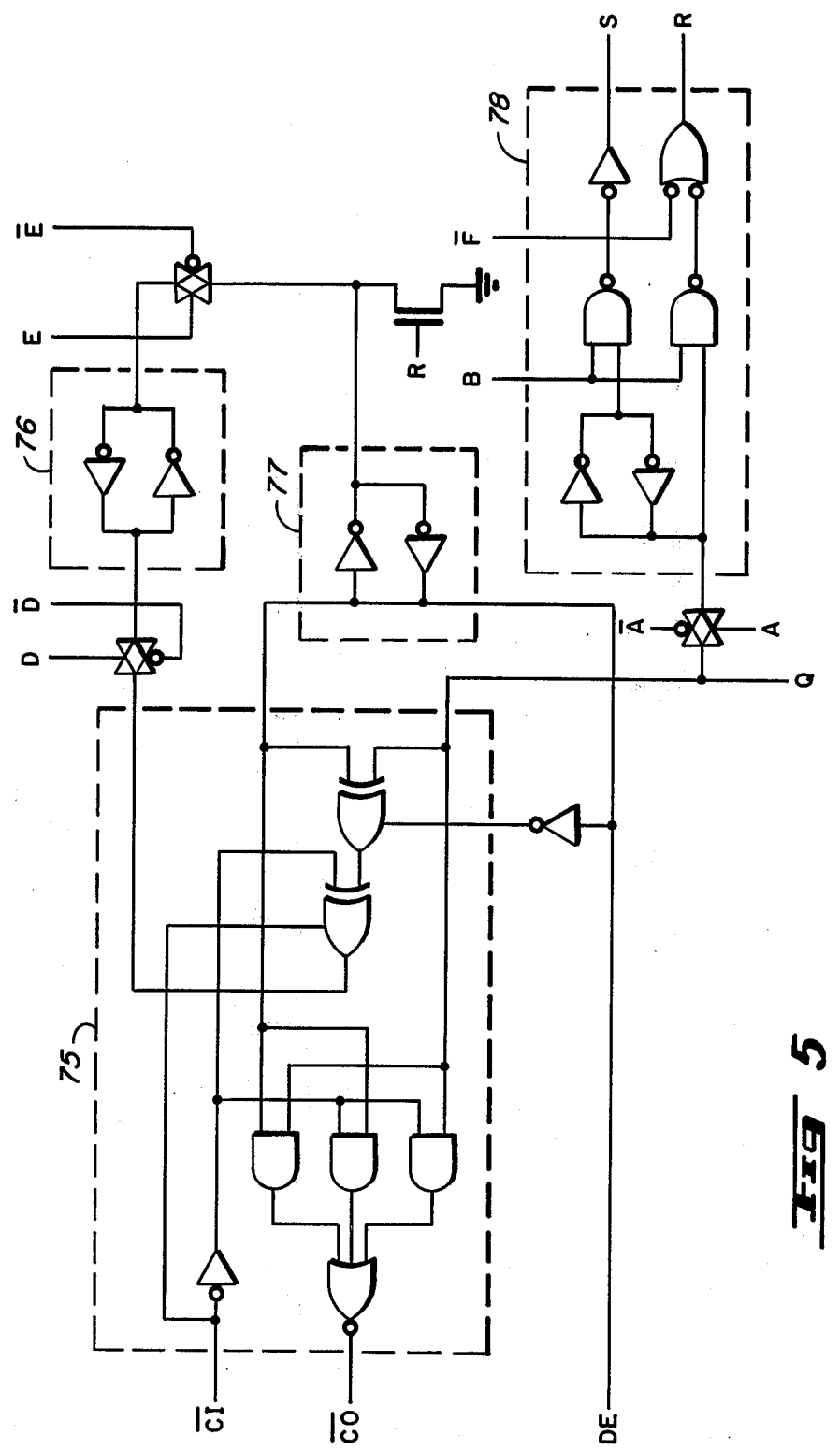
FIG. 5 represents in logic diagram form a portion of the circuitry used in the system of FIG. 1.

The usual approach to single slope analog to digital conversion is to convert the maximum expected input voltage to be measured, which is usually the power supply voltage $V_{DD}$, and to convert $V_{SS}$ which in the following discussion will be assumed to be ground or zero volts. The resulting conversion counts are then stored. When an unknown voltage is converted, the digital output is computed as Digital Result $= (C_{UNK} - C_{VSS})/(C_{VDD} - C_{VSS})$
$(2^n - 1)$ where $C_{UNK}$ is the counts for the unknown voltage, $C_{VSS}$ is counts obtained for the zero volt input, $C_{VDD}$ is counts obtained for the power supply voltage, and n is the number of bits in the converted result. Note that this result requires subtraction, division, and multiplication which requires a microprocessor or a large amount of logic circuitry. The approach taken in the present system, to calibrate the analog to digital converter, is to use a digital to analog converter to trim the discharge current from a capacitor until $C_{VDD} - C_{VSS} = 2^n - 1$ so that the Digital Result will then equal $C_{UNK} - C_{VSS}$. This only requires a substraction which can be done with much simpler circuitry than can division and multiplication. The subtraction is performed by presetting the counter in the analog to digital converter to the two's complement of the $V_{SS}$ conversion count.

The digital to analog converter (DAC) bits are gated in a manner to calibrate the single slope A/D converter. Referring first to FIG. 2, it can be seen that any conversion count, C, is related to the time, t, for the capacitor to discharge by the equation $$C = t(f_{clock})$$

where $f_{clock}$ is a clock frequency.

Also, the time t to discharge the integration capacitor $C_{INT}$ from a voltage V with a discharge current I is as follows:

$$t = \frac{C_{INT}(V - V_{TRIP})}{I}$$

Combining the two above equations we get $$C = C_{INT}f_{clock}/I(V - V_{TRIP})$$

Thus, the difference in the counts resulting from converting voltage $V_{DD}$ ($C_{VDD}$) and $V_{SS}$ ($C_{VSS}$) is $$C_{VDD} - C_{VSS} = f_{clock}C_{INT}/I(V_{DD} - V_{SS})$$

From this we can see that the product of $(C_{VDD} - C_{VSS})$ I is a constant;

$$(C_{VDD} - C_{VSS})I = f_{clock}C_{INT}$$
$$(C_{VDD} - V_{SS}) = \text{constant}$$

Thus, we can force $C_{VDD} - V_{DD}$ to equal $2^n - 1$ by setting the current I to the appropriate value. This is achieved by using a digital to analog converter as will be explained hereinafter.

A system used to accomplish the above will now be explained by referring first to FIG. 1. A capacitor 10 is shown coupled between a node 22 and a power supply reference node, illustrated as ground. Node 22 is coupled to a switch 23 which can be used to apply zero volts illustrated as ground, a known voltage illustrated as $V_{DD}$, or an unknown voltage illustrated as $V_{UNK}$ to capacitor 10. Node 22 is also coupled to an input of a comparator 11. Comparator 11 has a second input which receives a voltage illustrated as $V_{TRIP}$. Voltage $V_{TRIP}$ is a known reference voltage which establishes the level at which the voltage coming from node 22 will cause the output of comparator 11 to change. Comparator 11 provides an output which is coupled to a clock circuit 12. Clock circuit 12 receives a clock input and a start input. The clock input provides the pulses to the clock circuit which are used as inputs for counter 13, and a start input is used to enable clock circuit 12 so that it will pass the clock input pulses to counter 13. The output of comparator 11 is used to inhibit or stop clock circuit 12 so that it will cease passing the clock input pulses to counter 13.

Counter 13 counts the clock pulses received from clock circuit 12. The counts in counter 13 can be provided to a zero results register 14. Zero results register 14 serves as a conversion means converting the counts from counter 13 to the one's complement thereof. The one's complement number from zero results register 14 can then be coupled back to counter 13 where counter 13 can add a one to the one's complement signal to provide a two's complement signal. The use of the two's complements number will be explained hereinafter. The output of counter 13 is coupled to digital to analog enable register (DER) 18 by way of an adder 15 and an intermediate register (IR) 17. Adder 15 is capable of adding the contents of digital to analog enable register 18 to the contents of counter 13 and subtracting therefrom a quantity equal to $2^n - 1$. The quantity $2^n - 1$ is illustrated as being an input to adder 15, but in the preferred embodiment the quantity is actually built into the adder. The output of adder 15 is temporarily stored in intermediate register 17 before being coupled into DER 18. The reason for temporarily storing the output from adder 15 in intermediate registers 17 is to prevent from modifying the output, carried from DER 18 on line 19, to adder 15 during the add operation. Those persons skilled in the art will recognize that adder 15 and intermediate register 17 could be replaced by another counter.

Digital to analog enable register 18 also receives power on reset, POR, which is used to initialize or to reset DER 18 when power is first applied to the system. DER 18 also provides an output to digital to analog converter 21. Digital to analog converter 21 is illustrated as being referenced to a voltage $V_{EE}$ which in a preferred embodiment is a negative voltage. Digital to analog converter (DAC) 21 provides a controlled current sink output, $I_{OUT}$, to a switch 24. Switch 24 is illustrated as being capable of switching between node 22, which carries the output voltage of capacitor 10, and a dump voltage terminal. It should also be noted that switch 24 is capable of opening the line or path between node 22 and DAC 21, especially when capacitor 10 is being charged. The reason for illustrating DAC 21 as being referenced to a voltage $V_{EE}$ is to emphasize that capacitor 10 can be discharged to a negative voltage level. As those persons skilled in the art will recognize, switches 23 and 24 can be controlled by control logic which in the preferred embodiment is activated by the output from comparator 11.

At this point the configuration of the digital to analog converter 21 will be discussed in greater detail. Referring to FIG. 4, it is seen that a plurality of N channel current ratioed transistors illustrated by transistors 41 through 46 are controlled by current setting N channel transistor 40. The current flowing through transistor 40 is provided by any suitable current source having an output current $I_{in}$. Connected in series with transistors 41 through 46 are switches illustrated as N channel transistors 60 through 65 respectively. The drain electrodes of transistors 60 through 65 are connected to a line 69 which represents the output current. In a preferred embodiment, the output current is connected to a P channel current mirror which in turn controls the current through a high impedance current mirror. A suitable high impedance current mirror is illustrated in my co-pending patent application Ser. No. 96,275 filed Nov. 21, 1979, now abandoned, entitled "Current Mirror Circuit". The high impedance current mirror is the portion of digital to analog converter 21 which is referenced to voltage $V_{EE}$. As seen in FIG. 4 the source electrodes of transistors 40 through 46 are connected to ground instead of to $V_{EE}$. By arranging the DAC so that only the high impedance current mirror is referenced to $V_{EE}$, less current is required from the negative voltage power supply which is providing voltage $V_{EE}$.

The gate electrodes of switching transistors 60 through 65 are controlled by outputs from the digital to analog enable register, DER. Also connected in series with transistors 41 through 46 and enabled by the same control signal that enables transistors 60 through 65 are P channel transistors 50 through 55 respectively. These P channel transistors are connected from $I_{DUMP}$ line 68 to current setting transistors 41 through 46 respectively. The purpose of P channel transistors 50 through 55 is to avoid current spikes when transistors 60 through 65 are enabled. By having an $I_{DUMP}$ line 68, transistors 41 through 46 will already be conducting current and therefore will not exhibit a delay and/or a current spike when transistors 60 through 65 are enabled.

In a 9-bit digital to analog converter system, transistor 40 would have a current weight of 511 which is equal to $2^n-1$ where n is equal to 9. Transistor 41 would have a current weight of 512, transistor 42 would have a current weight of 256, transistor 43 would have a current weight of 128 and so forth down the line until transistor 44 would have a current weight of 4, transistor 45 would have a current weight of 2, and transistor 46 would have a current weight of 1. In a preferred embodiment, a 9-bit system is used for self-calibration in order to ensure a good 8-bit measurement of an unknown voltage.

A method of calibrating the analog to digital converter of FIG. 1 will now be explained. If it is assumed that power has just been applied to the analog to digital converter, the power on reset signal POR will reset digital to analog enable register 18. A reset is also provided for counter 13 and digital to analog converter 21. Switch 23 is then switched to the ground terminal, GND, so that a ground voltage is established on capacitor 10. Once this is done, switch 23 is opened and simultaneously clock circuit 12 is started, and switch 24 is switched over to node 22 line. This starts the counts flowing to counter 13 at the same time that capacitor 10 is discharged through control of digital to analog converter 21. The discharge of capacitor 10 is illustrated in FIG. 2 by line 30. As explained hereinbefore, capacitor 10 can be discharged to a negative voltage, and when capacitor 10 reaches a voltage level equivalent to $V_{TRIP}$, comparator 11 will provide an output which stops clock circuit 12 and switches switch 24 from node 22 to dump voltage. The counts accumulated in counter 13 are then converted by zero results register 14 to a one's complement number and are transferred back to counter 13. Counter 13 then adds one to the one's complement number to convert it to a two's complement number. Switch 23 is then switched to voltage $V_{DD}$ to charge capacitor 10 to $V_{DD}$. Once capacitor 10 has been charged to voltage $V_{DD}$ switch 23 is opened and simultaneously clock circuit 12 is started and switch 24 is switched to sense node 22. Capacitor 10 will then be discharged through control of digital to analog converter 21 until the charge across capacitor 10 reaches $V_{TRIP}$. Capacitor 10 discharges in a linear manner as illustrated by line 31 of FIG. 2. The high impedance current mirror which is controlled by digital to analog converter 21 insures that capacitor 10 discharges in a linear manner. The counts stored in counter 13, when capacitor 10 is discharged to $V_{TRIP}$ as illustrated by line 31, are transferred to adder 15 where they are added with the contents of DER 18 and subtracted from adder input $2^n-1$. Since the power on reset signal POR established $2^n-1$ in DER 18 the contents of adder 15 will be the contents of counter 13. The contents from adder 15 are then transferred to intermediate register 17 and from here they are loaded into digital to analog enable register 18. It should be noted that the contents in DER 18 which came from counter 13 are equal to $C_{VDD}-C_O$ since just previously counter 13 contained the two's complement of $C_O$, which was the count for discharging capacitor 10 from zero volts. By adding the count $C_{VDD}$ to the two's complement of $C_O$ the result of $C_{VDD}-C_O$ is obtained.

As stated hereinbefore the desired result is that $C_{VDD}-C_O$ equals $2^n-1$. If this result is obtained calibration is complete, otherwise, the procedure must be repeated by placing capacitor 10 at ground and continuing with the procedure until the count in counter 13 equals $2^n-1$ after sampling voltage $V_{DD}$. As shown hereinbefore, $$I(C_{VDD}-C_O)=\text{constant}.$$

Thus if $C_{VDD}-C_O \neq 2^n-1$, we want to multiply $$C_{VDD}-C_O \text{ by } (2^n-1)/(C_{VDD}-C_O)$$

Since $I(C_{VDD}-C_O)=$ constant, we can instead multiply I by $$(C_{VDD}-C_O)/(2^n-1)$$

and this will result in $C_{VDD}-C_O$ being multiplied by $$(2^n-1)/(C_{VDD}-C_O).$$

Thus since $$I_{OUT}=I_{In}DER/2^n-1,$$

where $I_{OUT}$ is the current out of the DAC on line 69 of FIG. 4, DER is the contents in the DER, and $I_{IN}$ is the current into transistor 40 of the DAC, the output current can be corrected by causing the contents of the DER to change. The contents in the DER are coupled from the adder. The adder's output is equal to the contents in the DER plus the counts in the counter minus $2^n-1$. The contents in the DER are the contents of the counter after one calibration cycle and the counter outputted a new $C_{VDD}-C_O$. If the new counter reading is high the current in $I_{OUT}$ must be increased, and if the counter reading is too low then the DAC output current ($I_{OUT}$) must be decreased.

Once the analog to digital converter is calibrated, then switch 23 can be switched to receive an unknown voltage $V_{UNK}$ which is applied across capacitor 10. Capacitor 10 is then allowed to discharge through control of digital to analog converter 21 while counter 13 is counting. When the unknown voltage across capacitor 10 reaches the level of $V_{TRIP}$, comparator 11 will provide an output which stops clock circuit 12 thereby inhibiting clock pulses to counter 13 and at the same time opening switch 24. The counts obtained for the unknown voltage will appear in counter 13. The discharge slope of capacitor 10, for the unknown voltage, is illustrated by line 32 in FIG. 2. Note that by subtracting line 30 from line 31 one obtains the value of voltage $V_{DD}$ with respect to zero volts and by the same token by subtracting line 30 from line 32 one obtains the value of the unknown voltage with respect to zero volts. $V_{TRIP}$ is chosen to be a negative voltage in order to allow for any offsets inherent in comparator 11. If $V_{TRIP}$ was set to zero volts and comparator 11 had a negative offset then the accuracy of the measurement of the unknown voltage would be compromised.

FIG. 3 offers in graphical form an outline of the calibration steps of the present analog to digital converter. The voltage across capacitor 10 is illustrated by the vertical axis while the time, t, which is related to the counts is illustrated along the horizontal axis. When voltage is first supplied to the analog to digital converter the voltage across capacitor 10 will not be known. However, when switch 23 is switched to the ground position then zero volts is applied to capacitor 10 as illustrated at point 35. Capacitor 10 is then discharged commencing at point 36 and the discharging continues until voltage level $V_{TRIP}$ is reached as illustrated at point 37. The counts obtained for the zero reading are then converted to a two's complement number and at point 38 voltage $V_{DD}$ is applied to capacitor 10. Capacitor 10 is once again discharged until the voltage level across capacitor 10 reaches $V_{TRIP}$ as illustrated at point 39. As explained hereinbefore if at this point the counts in counter 13 are not equal to $2^n-1$ the procedure is repeated starting at point 35.

FIG. 5 illustrates a one bit portion of part of the circuitry of the analog to digital converter of FIG. 1. The circuitry contained within dotted lines 75 represents a one bit portion of adder 15 of FIG. 1. A transmission gate which is enabled by timing signals D and $\overline{D}$ is used to transmit the output from circuitry 75 to a latch circuit enclosed within dotted lines 76 which represents a one bit portion of intermediate register 17. The output of the circuitry enclosed within dotted lines 76 is coupled by another transmission gate, which is enabled by timing signals E and $\overline{E}$, to another latch enclosed within dotted lines 77 which represents a one bit portion of the digital to analog enable register 18. Enclosed within dotted lines 78 is a one bit portion of the zero results register 14. It should be noted that adder 15 is a two bit parallel adder with a carry. Only two bits are required since subtracting $2^n-1$ from the sum of two numbers is the same as putting a carry in (CI) of one in the first bit and inverting the last bit of the two number sum.

By now it should be appreciated that there has been provided a single slope analog to digital converter having self-calibrating features which can be made on an integrated circuit chip. The logic circuitry is simplified by avoiding the need for multiplication or division operations in obtaining the result. The digital to analog converter of the present invention is capable of providing results accurate to within plus or minus a half of a bit.

I claim:

1. An analog to digital converter, comprising:
   a digital to analog converter;
   a digital to analog enable register coupled to the digital to analog converter for controlling the digital to analog converter;
   a counter coupled to the digital to analog enable register for providing inputs to the digital to analog enable register;
   a clock circuit coupled to the counter for controllably providing an input to the counter;
   a conversion register coupled to the counter for converting a binary count from the counter into a converted count and coupling the converted count to the counter;
   a comparator having a first input coupled to a first reference, a second input and an output coupled to the clock circuit for controlling the counter; and
   a capacitor for storing an analog voltage, the capacitor having a first terminal selectively coupled to the second input of the comparator, the digital to analog converter and the analog voltage, and a second terminal coupled to a second reference.

2. The analog to digital converter of claim 1 wherein the converted count of the conversion register is a ones complement number of the binary count from the counter.

3. The analog to digital converter of claim 1 further including an adder coupled to the counter and to the digital to analog enable register for adding the contents of the counter and the digital to analog enable register and for providing an output; and an intermediate register coupled between the adder and the digital to analog enable register for coupling the output from the adder to the digital to analog enable register.

4. A method of calibrating an analog to digital converter comprising a digital to analog converter, a counter, and a capacitor, and which is capable of providing an n binary output signal where n equals the maximum number of binary bits, comprising the steps of:
   setting the digital to analog converter to $2^n-1$;
   resetting the counter to a predetermined starting value;
   acquiring a zero potential charge on the capacitor;
   simultaneously coupling the capacitor to the digital to analog converter to controllably discharge the capacitor and starting the counter;
   stopping the counter when the capacitor has discharged to a predetermined level;
   converting a count obtained in the counter to a two's complement number;
   acquiring a predetermined voltage on the capacitor;
   simultaneously coupling the capacitor to the digital to analog converter to controllably discharge the capacitor and starting the counter;
   stopping the counter when the capacitor has discharged to the predetermined level; and if the converted contents of the counter are not equal to $2^n-1$, loading the difference between $2^n-1$ and the sum of the converted contents of the counter and the contents of the digital to analog enable register into the digital to analog enable register and repeat all steps beginning with resetting the counter.

5. An analog to digital converter capable of self-calibration, comprising:
   clock means for controllably providing an output;
   counter means coupled to the clock means to provide a count of the clock means output;
   conversion means coupled to the counter to provide a one's complement of the count in the counter means;
   a digital to analog enable means coupled to the counter means providing control outputs representative of the count in the counter means;
   a digital to analog converter coupled to the digital to analog enable means and responsive thereto;
   means selectively coupled to the digital to analog converter, for storing a charge;
   and means having a first input coupled to the means for storing a charge, a second input coupled to a reference and an output coupled to the clock means for comparing the charge to said reference, and controlling said clock means in response to said comparison.

6. The analog to digital converter of claim 5 wherein the means for storing a charge is a capacitor.

7. The analog to digital converter of claim 5 further including:
   means coupled to the counter means and to the digital to analog enable means for adding the count of the counter means and contents of the digital to analog enable means, and providing an output to the digital to analog enable means.

8. The analog to digital converter of claim 7 further including means for temporarily storing the contents of the means for adding, coupled between the means for adding and the digital to analog enable means.

9. A method of calibrating a single slope analog to digital converter comprising a counter, a digital to analog converter and a capacitor and which is capable of providing an n binary output signal where n equals the maximum number of binary bits, comprising the steps of:
   (a) setting the digital to analog converter to $2^n - 1$;
   (b) resetting the counter to a predetermined starting value;
   (c) establishing a zero potential on a capacitor;
   (d) simultaneously discharging the capacitor at a rate established by the digital to analog converter and starting the counter;
   (e) stopping the counter when the capacitor has reached a predetermined level of charge;
   (f) converting the contents of the counter to two's complement;
   (g) establishing a predetermined voltage potential on the capacitor;
   (h) simultaneously discharging the capacitor at a rate established by the digital to analog converter and starting the counter;
   (i) stopping the counter when the capacitor has discharged to the predetermined level of charge;
   (j) if the contents of the counter are not equal to $2^n - 1$, replace the contents of the digital to analog converter with the sum of the present contents thereof and the contents of the counter and digital to analog enable register less $2^n - 1$, and repeat steps (b) through (j).

10. The method of claim 9 wherein the capacitor is discharged to a negative voltage.

11. A single slope a/D converter using a DAC for controllably discharging a capacitor, comprising:
   a comparator having a first and a second input and an output, the first input being coupled to the capacitor, the second input being coupled to a reference level;
   clock means having an output and an input coupled to the output of the comparator which inhibits the output from the clock means;
   a counter coupled to the output of the clock means;
   a conversion register coupled to the counter for converting a binary count from the counter into a converter count and coupling the converted count to the counter; and
   means for controlling the DAC using counts in the counter and coupling the counter to the DAC.

* * * * *

UNITED STATES PATENT AND TRADEMARK OFFICE
CERTIFICATE OF CORRECTION

PATENT NO. : 4,344,067
DATED : August 10, 1982
INVENTOR(S) : Robert D. Lee

It is certified that error appears in the above-identified patent and that said Letters Patent are hereby corrected as shown below:

On the front page, delete the lower figure in its entirety.

In column 7, claim 1, line 52, change "An" to --A single slope-- and on line 64, change both occurrences of "converted" to --complemented--.

In column 8, claim 5, line 55, after "means" insert --and to insert said complement into the counter--.

In column 10, claim 11, line 16, change "a/D" to --A/D-- and on line 28, change "converter" to --complemented-- and change "converted" to --complemented--.

Signed and Sealed this

Seventh Day of December 1982

[SEAL]

Attest:

Attesting Officer

GERALD J. MOSSINGHOFF
Commissioner of Patents and Trademarks